(12) United States Patent
Robinson et al.

(10) Patent No.: US 7,936,210 B2
(45) Date of Patent: May 3, 2011

(54) GALLIUM NITRIDE TRAVELING WAVE STRUCTURES

(75) Inventors: Kevin L. Robinson, Clay, NY (US);
Paul Saunier, Addison, TX (US);
Hua-Quen Tserng, Dallas, TX (US)

(73) Assignee: Lockheed Martin Corporation, Bethesda, MD (US)

( * ) Notice: Subject to any disclaimer, the term of this patent is extended or adjusted under 35 U.S.C. 154(b) by 1116 days.

(21) Appl. No.: 11/705,344

(22) Filed: Feb. 12, 2007

(65) Prior Publication Data
US 2010/0277233 A1 Nov. 4, 2010

(51) Int. Cl.
*H01L 25/00* (2006.01)

(52) U.S. Cl. ........................................ 327/581; 327/566

(58) Field of Classification Search .................. 327/564, 327/565, 566, 581
See application file for complete search history.

(56) References Cited

U.S. PATENT DOCUMENTS

| | | | |
|---|---|---|---|
| 4,733,195 A | 3/1988 | Tserng et al. | |
| 5,488,232 A | 1/1996 | Glass et al. | |
| 7,365,374 B2 * | 4/2008 | Piner et al. | 257/189 |
| 7,453,329 B2 * | 11/2008 | Inoue | 333/81 A |
| 2006/0197129 A1 | 9/2006 | Wohlmuth | |

OTHER PUBLICATIONS

International Search Report dated Jun. 1, 2009.

* cited by examiner

*Primary Examiner* — Jeffrey S Zweizig
(74) *Attorney, Agent, or Firm* — Howard IP Law Group, PC

(57) ABSTRACT

A traveling wave device employs an active Gallium Nitride FET. The Gallium Nitride FET has a plurality of gate feeding fingers connecting to an input gate transmission line. The FET has a drain electrode connected to an output drain transmission line with the source electrode connected to a point of reference potential. The input and output transmission lines are terminated with terminating impedances which are not matched to the gate and drain transmission lines. The use of Gallium Nitride enables the terminating impedance to be at much higher levels than in the prior art. The use of Gallium Nitride permits multiple devices to be employed, thus resulting in higher gain amplifiers with higher voltage operation and higher frequency operation. A cascode traveling wave amplifier employing GaN FETs is also described having high gain and bandwidth.

19 Claims, 11 Drawing Sheets

GALLIUM NITRIDE TRAVELING WAVE STRUCTURES

FIELD OF THE INVENTION

The present invention relates to traveling wave devices and more particularly to a traveling wave structure using Gallium Nitride (GaN) transistors.

BACKGROUND OF THE INVENTION

Reliable high gain amplification is often required for a variety of radar applications, such as missile seeking applications, phased arrays and other high frequency operations. Such systems typically operate at frequencies above Ka-band, which is from about 18-40 GigaHertz (GHz). Frequencies above 40 GHz are referred to as millimeter frequency bands. It would be desirable to operate such systems at high frequencies well above 50 GHz and approaching for example, 100 GHz and above. Lower frequency devices are also desired in the 1-24 GHz range for wideband electronic warfare (EW), jammer and decoy applications. Prior art structures providing amplification at high frequencies have proven unsatisfactory and very few devices can even operate at high power above 50 GHz. Therefore, in order to improve power output and bandwidth, new amplification devices are needed.

Traveling wave devices have been employed in the prior art. Such devices have been designed using Gallium arsenide (GaAs) fabrication techniques. Prior art devices use Gallium arsenide substrates using MESFET or pHEMT device technology. For example, reference is made to U.S. Pat. No. 4,733,195 entitled, "Traveling Wave Microwave Device" issued on Mar. 22, 1988, to Hua Q. Tserng et al and assigned to Texas Instruments, Inc. That patent describes a traveling wave transistor structure with input and output transmission lines terminated with unmatched impedances to improve high frequency response by reflection and phase shift. Embodiments include employing a MESFET structure traveling wave transistor with periodically spaced gate feeding fingers. The Gallium arsenide (GaAs) structures include a plurality of cascaded FET devices to implement a traveling wave amplifier. To achieve higher gain, many FET devices may be cascaded. Based on the traveling wave operation, a large gain can be obtained. However, operation of such GaAs devices is limited in power density and bandwidth. In prior art devices the capacitance between the gate and source electrodes ($C_{gs}$) of such FETs is very high and the power is limited by the voltage breakdown of the devices. It is desirable to achieve extended frequency range, improved bandwidth, improved gain and provide a device which is small and operates at higher efficiency. Such attributes would enable one to design devices which have reduced size, weight and power consumption.

SUMMARY

The present invention provides a distributed traveling wave amplifier capable of operating over a wide bandwidth employing Gallium Nitride semiconductors for high power density.

In one embodiment, a traveling wave device comprises at least one active Gallium Nitride (GaN) FET device having a plurality of gate feeding fingers connecting the gate electrodes to an input gate transmission line, and having a drain electrode connected to an output drain transmission line with the source electrode connected to a point of reference potential.

A second embodiment, a traveling wave device comprises a plurality of Gallium Nitride (GaN) amplifier circuits arranged in cascode from a first circuit to a last circuit, each circuit being a cascode amplifier having a first GaN FET in series with a second GaN FET with the source electrode of the first FET connected to a point of reference potential; a gate transmission line, having a semiconductor for corresponding tracks, with the gate of the first FET connected to an associated terminal of the transmission line, with the drain of the first FET connected to the source of the second FET. A drain transmission line having input terminals for connection levels with the drain of the second FET connected to an associated input terminal of the drain transmission line with the gate electrode of the second FET directed to a point of reference potential through a frequency relative network operative to bypass all signal frequencies to the point of reference potential to cover the second FET to operate the common gate circuit with each circuit cascaded by the respective connection of the circuits to the gate and drain transmission lines.

DETAILED DESCRIPTION OF THE INVENTION

Figure 1:
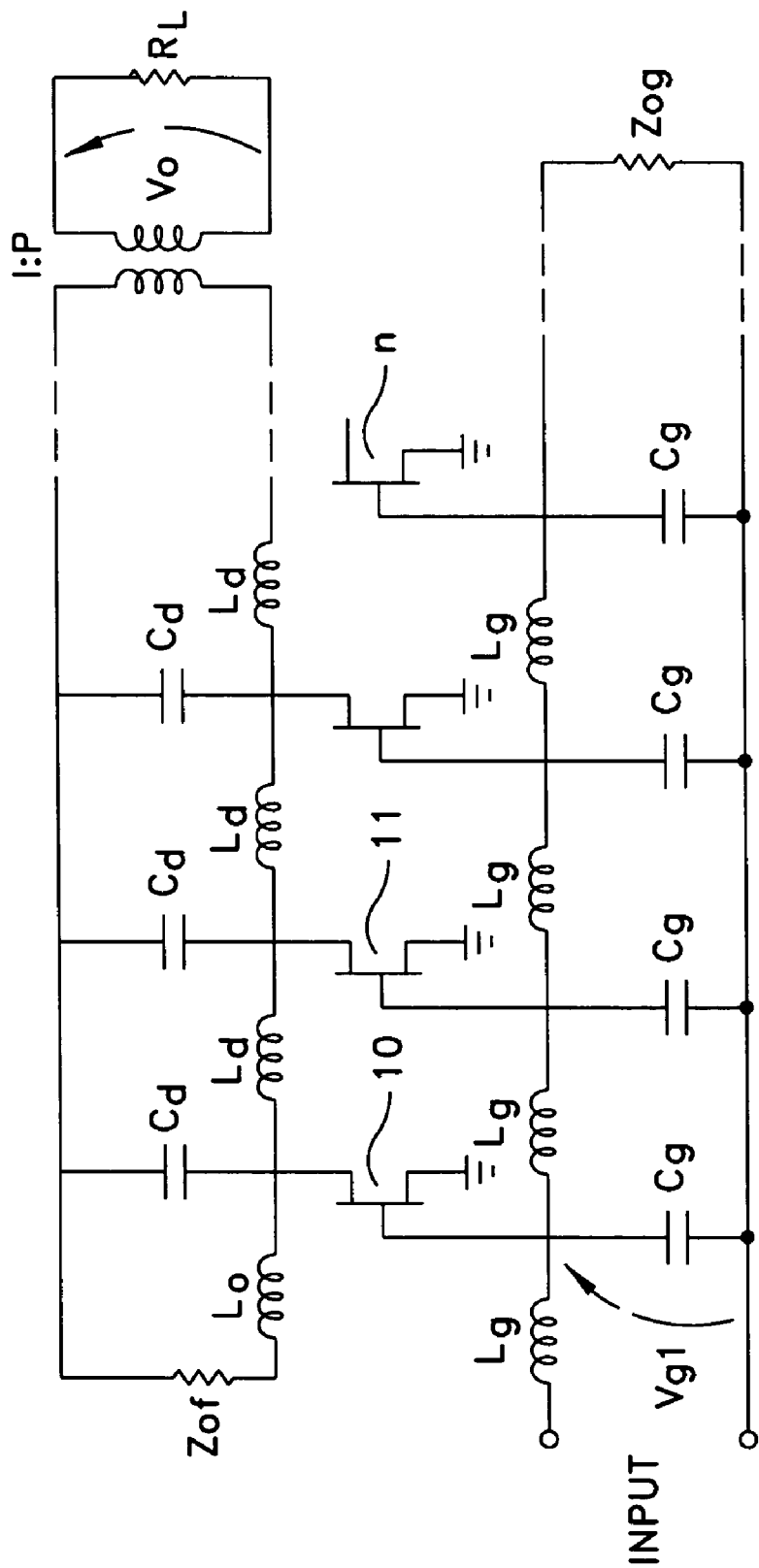
FIG. 1 is a schematic circuit diagram of a traveling wave amplifier employing FET devices as utilized in the prior art.
Figure 4:
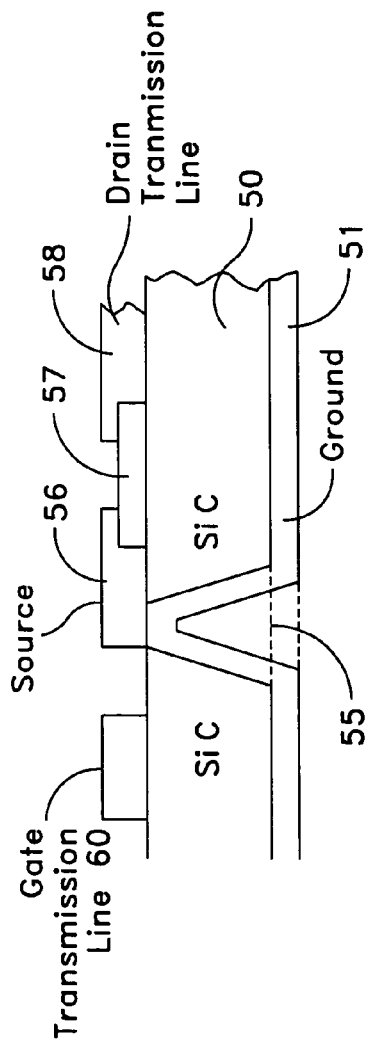
FIG. 4 is a schematic cross-sectional view of a Gallium Nitride device according to an embodiment of the invention.

Referring to FIG. 1, there is shown a traveling wave FET distributed amplifier according to the prior art. The structure shown in FIG. 1 is depicted in FIG. 4 of U.S. Pat. No. 4,733, 195 ('195 Patent) entitled, "Traveling Wave Microwave Device" and referenced above. In FIG. 1, the plurality of FET devices as 10, 11 and N are arranged in a series or distributed configuration to form a traveling wave amplifier device. In such an amplifier one can have matched terminations for the gate and drain. These are designated as $Z_{Og}$ and $Z_{Od}$ in FIG. 1. The multiple sections as shown by transistors 10, 11 and N allow a multistage filter for wide band applications. Serial combining means that the last device in the chain, which is designated by reference numeral N, is at a higher voltage level than any previous device. $C_g$ is the main effective bandwidth limiter for each stage. $C_g$ essentially represents the gate capacitance, while $L_g$ is the gate inductance. $C_d$ is the drain capacitance, while $L_d$ is the drain inductance. As seen from FIG. 1, a drain and a gate transmission line enables traveling wave amplification. The standard implementation of such a device as depicted in FIG. 1 employs MESFETs or pHEMTs. These devices are formed from Gallium arsenide on a Gallium arsenide substrate. The gate to source ($C_{gs}$) capacitance of a Gallium arsenide device, such as a MESFET or pHEMT is very high. The power output of the amplifier is limited by the voltage breakdown of the last device. This would be the voltage breakdown, for example of FET N. For Gallium arsenide this voltage breakdown is about 15 volts. Thus, the output is limited by the breakdown voltage of the last device. It is indicated that if one considers an ideal lossless traveling wave transistor which is made of N common source connected FETs with the gate and drain capacitances absorbed into the gate and drain transmission lines respectively, one yields a lumped $L_g C_g$ for the gate transmission line and $L_d$ and $C_d$ for the drain transmission line. The transmission lines are terminated with their characteristic impedance, namely $Z_{0g}$ and $Z_{0d}$.

Figure 2:
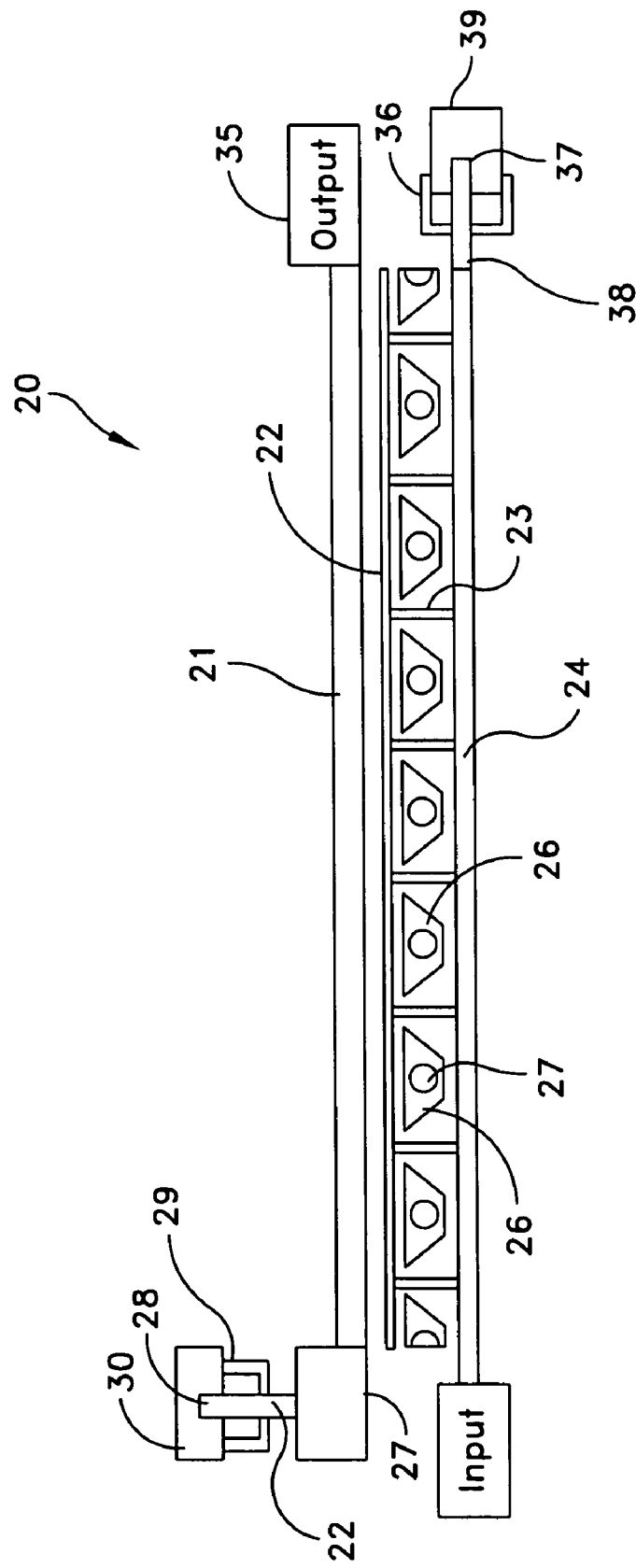
FIG. 2 is a schematic illustration of a traveling wave device according to an embodiment of the invention.
Figure 3:
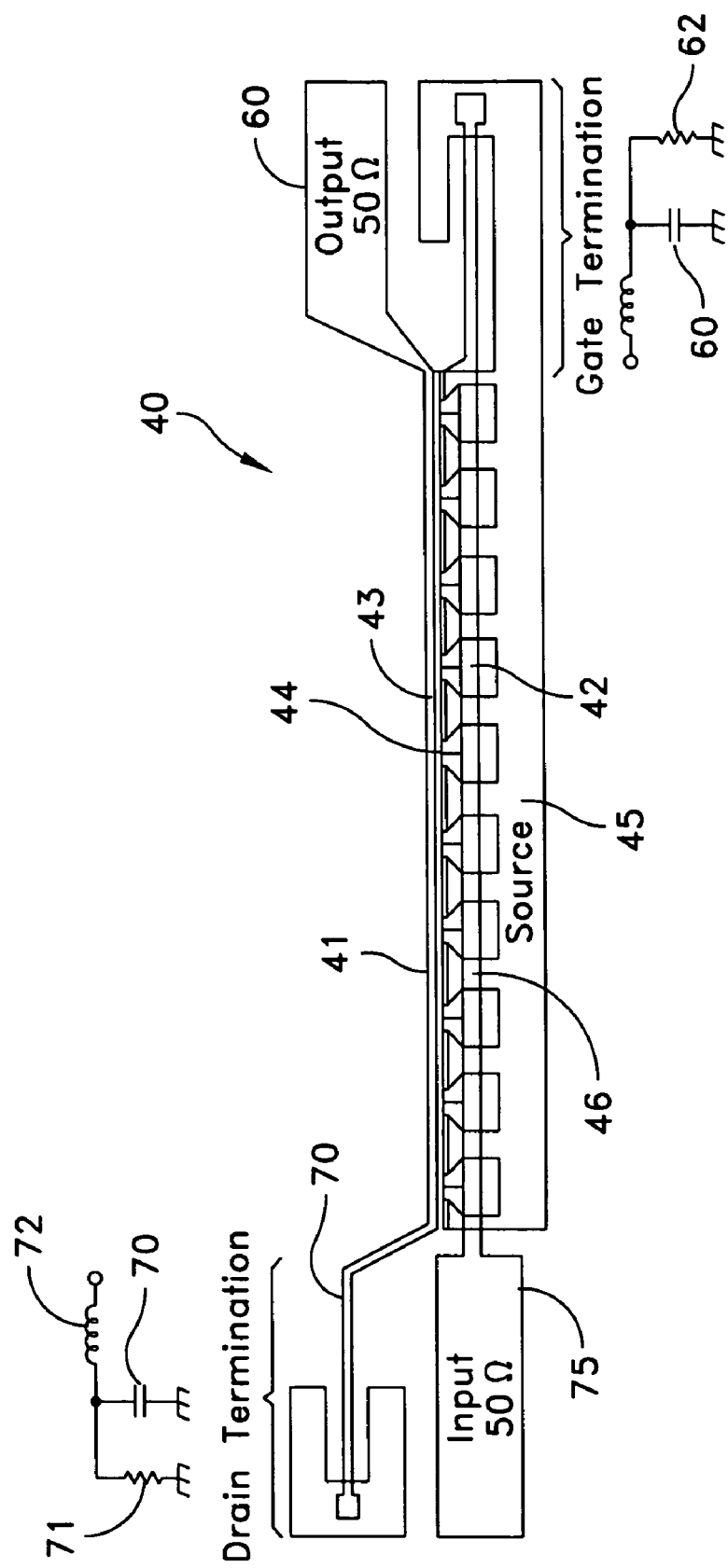
FIG. 3 is a schematic illustration of traveling wave device according to another embodiment of the present invention.

Embodiments of the present invention utilize the structure depicted in FIGS. 2 and 3 representative of the U.S. Pat. No. 4,733,195 shown as FIG. 3A and FIG. 7 respectively. Essentially, FIG. 2 is consistent with FIG. 7 of the above-noted patent, while FIG. 3 is consistent with FIG. 3A of the above-referenced patent. However, the devices employed in the present invention as compared to the prior art, are Gallium Nitride semiconductors. Gallium Nitride semiconductors when utilized for traveling wave amplification provide wide bandwidth and very high power density. A Gallium Nitride semiconductor has a very low gate to source capacitance ($C_{gs}$) and a high power density. This allows finer distribution of power by distributing the capacitance in smaller pieces. Thus, the distributed amplifier architecture as depicted in FIGS. 2 and 3 operates with a large number of sections before the point of limited gain bandwidth is reached. This means that more transistors can be utilized in series employing Gallium Nitride devices rather than GaAs devices. This allows for a wider bandwidth than that available with GaAs devices as provided in the prior art. The higher operating voltage of Gallium Nitride based semiconductors allows high power at higher impedances than any other competing technologies. This is very beneficial to the distributed architecture where the power combining is serial in nature with the last device seeing more power contribution than the preceding devices. Combination of these technologies provides unexpected results in that it allows increased bandwidth, increased efficiency, increased operating frequency and power levels above prior art approaches. This technique also enhances the performance of phased array radar, EW, jammer and decoy systems.

As indicated, one can employ a Gallium Nitride HEMT device or a Gallium Nitride mHEMT on a silicon carbide or silicon substrate. The capacitance between source and gate is much lower for similar high power levels ($C_{gs}$). The lower $C_{gs}$ allows the stacking of more stages. More stages equates to more filter sections and wider bandwidth than any bandwidth attainable in Gallium arsenide. The high voltage breakdown of GaN (50 volts) allows one to fabricate high power microwave devices in an extremely small size. Thus, an amplifier utilizing Gallium Nitride devices, allows more sections with wider bandwidths, flatter response, in much smaller devices than obtained with Gallium arsenide. The higher impedance level allows multiple cells to be combined efficiently. This provides for a more compact structure and therefore enables higher frequency operation.

Referring to FIG. 2, there is shown a detailed diagram of a traveling wave device according to an embodiment of this invention. The device of FIG. 2 employs a single GaN transistor having multiple gate fingers. Disposed on a substrate of silicon carbide 20 is a traveling wave device. The traveling wave device has a drain transmission line 21 which is connected to the drain electrode of the device. The gate electrode designated by reference numeral 2 comprises a plurality of fingers 23. The gate feeding fingers 23 are connected to a gate transmission line 24. The transistor has source electrodes designated by the trapezoidal figure or source contact 26. There is a via hole 27, which enables one to connect the source electrode 26 to a point of reference potential. As seen there is an output or a DC blocking capacitor 27 which is coupled to a parallel capacitor and resistor 28 and 29 which has their terminals connected to reference potential or ground 30 through a ground contact. There is a common inductor 31 which acts as a terminating inductor. The output is obtained at contact 35, with resistor 36 and capacitor 37 and inductor 38 connected at one terminal to ground 39. As seen in FIG. 2, the structure can be easily integrated on a substrate of silicon carbide. This depicts a single distributed active device which is monolithically fabricated on a silicon carbide substrate 20. The transistor has a gate electrode, having a plurality of fingers each connected to gate transmission line 24 with the drain electrode connected to a drain transmission line. In one configuration, the transmission lines are microstrip lines fabricated on the substrate 20.

As one can ascertain, the transistor employed in FIG. 2 is a single device which has multiple gate electrodes, a drain electrode, and a source electrode. Such devices are well known and are available from many sources (e.g., Fujitsu Laboratories) and are in fact fabricated from Gallium Nitride (GaN). For example, one such Gallium Nitride high electron mobility transistor (HEMT) device can achieve output power of 170 watts at 63 volts. The breakdown voltage, as indicated is particularly suitable for use in a traveling wave device as seen. In this manner more stages can be cascaded to develop a high voltage device. As one can ascertain, a HEMT device is a FET that takes advantage of the operation of the electron layer at the boundary between different semiconductor materials. This operation is rapid compared to that within conventional semiconductors. Other companies, such as Toshiba America Electronic Components have also made high frequency Gallium Nitride power field effect transistors. These devices can also achieve a high output power of 170 watts at high frequencies above 10 GHz. Such devices of course are particularly suitable for operation in the above described concepts. As one can see, utilizing these high breakdown voltages, the Gallium Nitride traveling wave device provides superior operation over prior art Gallium arsenide devices. Gallium Nitride has an energy gap value that approaches 3.4 eV at room temperature, enabling Gallium Nitride devices to support peak internal electric fields of about 5 times higher than silicon or Gallium arsenide (GaAs). Higher electric field strength results in higher breakdown voltages. This is a key attribute for handling high power requirements and for achieving much higher efficiencies through the use of higher voltage supplies. For high frequency performance high electron speeds are necessary to minimize internal device delays. In Gallium Nitride the velocity increases linearly with the electric field in low field environments, with the electron mobility serving as the proportionality constant. One can also employ aluminum Gallium Nitride (AlGaN). Aluminum Gallium Nitride has an even higher energy gap than Gallium Nitride. Silicon impurities donate electrons to the crystal that tend to accumulate in the regions of lowest potential known as a quantum well. This quantum well exists just beneath the aluminum Gallium Nitride interface. Thus, one can obtain FET structures from either Gallium Nitride or from Aluminum Gallium Nitride.

FIG. 2 depicts a single distributed GaN MESFET device which is fabricated on a silicon or silicon carbide substrate. The MESFET includes a gate electrode 22 having a plurality of fingers 23 connecting the gate to a gate microstrip transmission line 24. There is shown the drain transmission line 21 for the drain electrode and the source contacts which are grounded through vias 27 to the ground plate of the assembly 51 (FIG. 4). The drain and gate transmission lines 21 and 24 are each terminated in an unmatched impedance at output 27 and inputs providing substantial reflection and phase at a given frequency where the given frequency is at the upper end of the frequency band of the traveling wave device. The sum of the phase shifts of the termination impedances for the drain and gate lines approximates the sum of the phase shift along the length of the transmission lines as shown in the '195 Patent.

Referring to FIG. 3 there is shown an alternate embodiment of a Gallium Nitride based traveling wave device. FIG. 3 shows the device fabricated on a substrate of silicon carbide 40. The substrate contains a drain electrode, connected to a drain transmission line 41. A plurality of gate finger electrodes 44 are each connected to a gate transmission line 42. The gate electrode is connected to the gate transmission line via the gate feeding fingers 44. The source electrode is shown and indicated by reference numeral 45. An air-bridge 46 is shown between the gate electrode 42 and the drain electrode. There is an output terminal 60 which is terminated by means of a resistor 62 and a capacitor 61. This terminates the gate transmission line and operates as the output impedance for the gate transmission line. There is further shown an input termination consisting of the inductor 70 connected to a parallel combination of resistor 71 and capacitor 70. These are in turn associated with inductor 71. The input contact 75 may typically have an input impedance of 50 ohms, with the output 60 also having a typical output impedance of 50 ohms. As seen, the device is structured on a substrate of silicon carbide as is the device of FIG. 2. It is understood that the apparatus or devices of FIGS. 2 and 3 can be cascaded as in FIG. 1 to obtain multiple stage devices.

Referring to FIG. 4 there is shown a Gallium Nitride device fabricated on a substrate of silicon carbide or silicon. A substrate of silicon carbide 50 has a ground metal layer 51 deposited thereon. Via 55 enables one to make contact to the source electrode 56 of the active Gallium Nitride layer 57. The drain electrode is shown by reference numeral 58 and is connected to a drain transmission line. This transmission line is configured as a microstrip line. There is also shown a gate transmission line 60 to which all gate finger electrodes are connected. The source electrode is connected by via 55 to the ground plane or reference plane 51. The device shown in FIG. 4 is fabricated from Gallium Nitride. As indicated, Gallium Nitride devices offer higher impedances which enables one to ease input matching at high bandwidth. Thus, the characteristic impedance for such devices can be higher.

The device depicted in FIG. 4 may be fabricated using vapor deposition techniques for the growth of Gallium Nitride on silicon carbide or silicon. The vapor deposition includes MOCVD techniques. As indicated, Gallium Nitride has many advantages. Gallium Nitride is a very hard, mechanically stable material having a large heat capacity. In its pure form, it resists cracking and can be deposited in thin film on sapphire or silicon carbide in spite of the mismatch in their lattice constants. Gallium Nitride can be doped with silicon to provide N type Gallium Nitride. However, the silicon atoms change the growth of the Gallium Nitride crystals and introduce tensile stresses to make them relatively brittle. However, this is not a problem for fabrication of high frequency devices.

Figure 5:
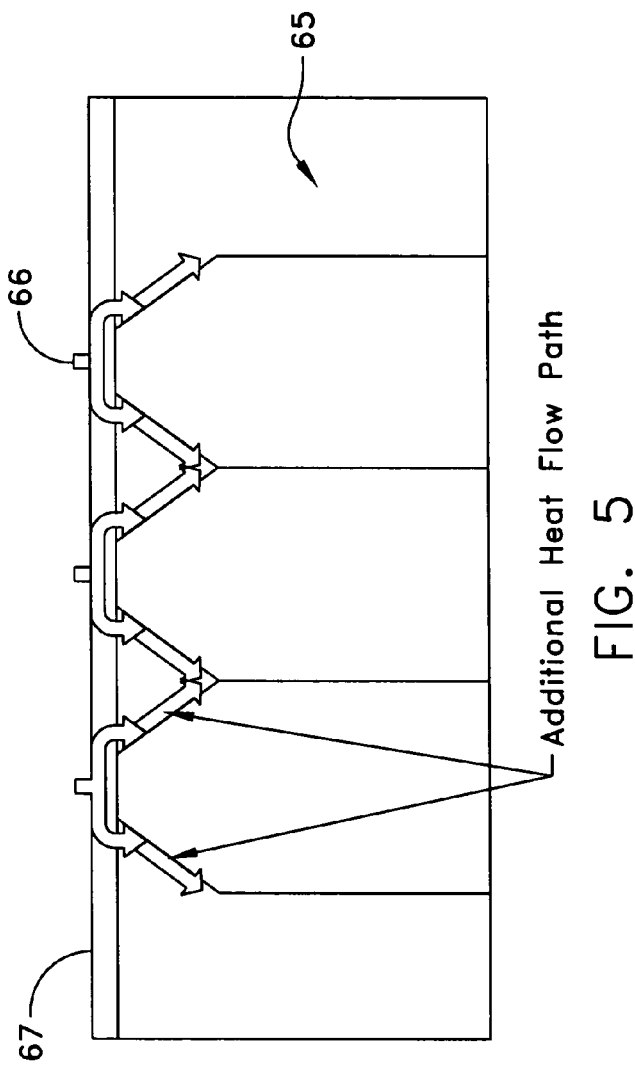
FIG. 5 depicts a cross-sectional view of a Gallium Nitride semiconductor fabricator on a silicon carbide substrate.

Referring to FIG. 5, there is shown a Gallium Nitride epitaxial device which is fabricated on a substrate of silicon carbide 65. The substrate of silicon carbide is diamond coated with a layer which is up to 10 micrometers (urn) thick. The layer of diamond oxide has epitaxially grown thereon Gallium Nitride to form a gallium nitride transistor device as seen in FIG. 5. Reference numeral 66 refers to the gate finger which is the end view on a Gallium Nitride device. Other fingers are shown. The diamond coating allows for additional heat flow into the silicon carbide substrate. In FIG. 5, the lateral spreading as shown reduces gate finger temperatures by about 20 degrees Celsius (20° C.). The reduction of gate finger temperature enables one to use a distributed amplifier architecture having smaller devices. This allows for more bandwidth for a radar, EW, jammer or decoy system. The smaller devices possess a lower $C_{gs}$ therefore enabling more sections to be available and to possess a wider bandwidth filter design. This results in higher capability distributed amplifier designs using the circuit configuration shown above. This also allows higher frequency operation due to the small device size. Such devices, for example, are Gallium Nitride HEMT or mHEMT on silicon carbide substrate which is coated with a diamond directly under the epitaxial layer. As indicated, the $C_{gs}$ is much lower for similar high power levels. The power density is higher. So again this requires a lower $C_{gs}$. The lower $C_{gs}$ allows the stacking of more stages. More stages equate to more filter sections and a wider bandwidth than any device obtainable in Gallium arsenide. The higher voltage which is a 120 volt breakdown allows high power MMICs. There is, thus, a thermal conductivity improvement over Gallium arsenide of at least a factor of ten.

Figure 6:
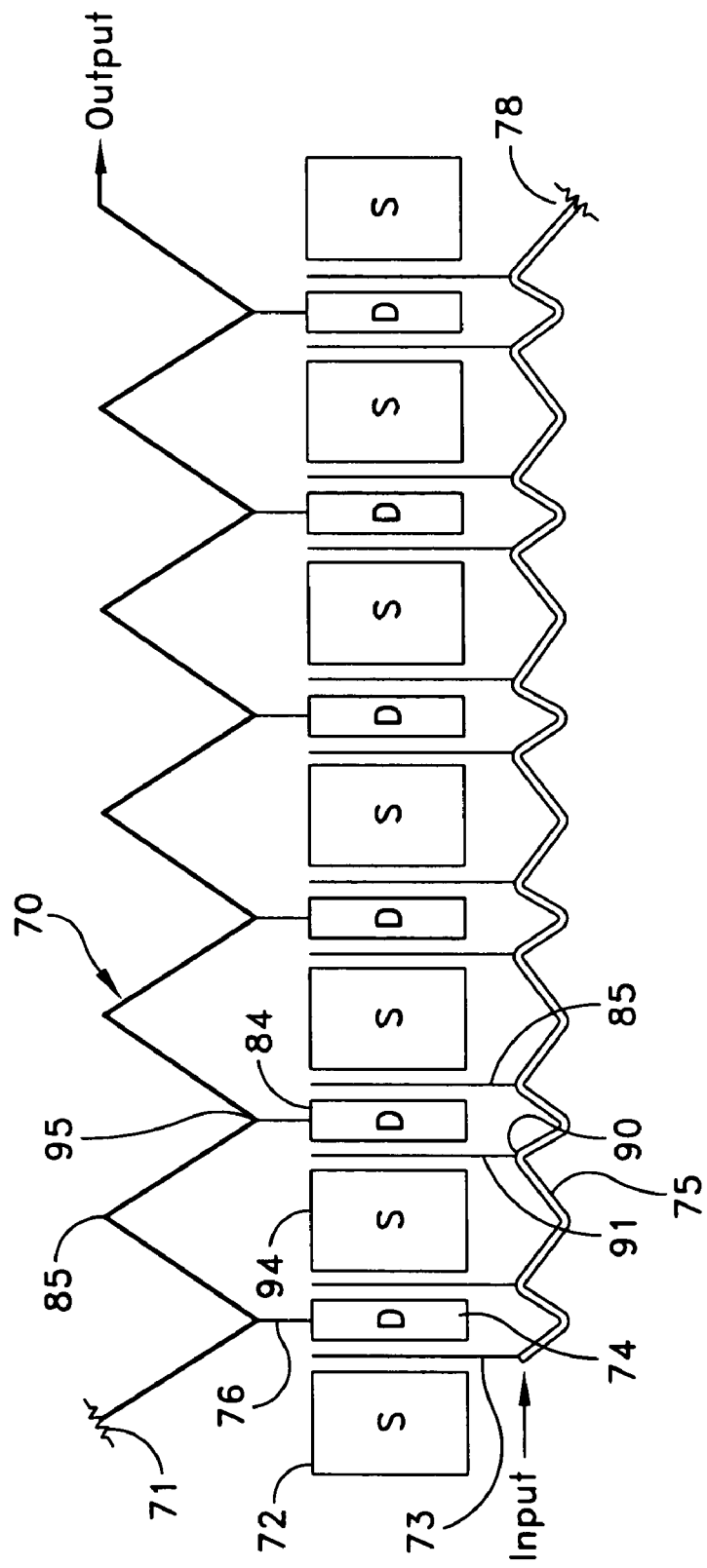
FIG. 6 depicts a simple schematic view of a Gallium Nitride FET distributed amplifier employing a drain and a gate transmission line.

Referring to FIG. 6, there is shown a general systematic diagram of a typical distributed amplifier utilizing Gallium Nitride field effect transistors. As seen in FIG. 6, each field effect transistor has a source electrode 72 and a drain electrode 74. Located between the source and drain electrode is a gate electrode 73. The drain electrodes of the FET Gallium Nitride devices are each connected to a drain transmission line 70. As seen, the transmission line is basically a triangular configuration having equal positive and negative slopes and is directed between the drain electrode 74 for the first transistor and the drain electrode 84 of the next transistor and so on. As seen, the peak of the triangular waveform 85 is located relatively at the center of the source electrode. In a similar manner, the gate electrodes 73, 85 and so on are connected to a gate transmission line 75. The gate transmission line, as seen, is asymmetrical and basically has a first symmetrical portion extending between the source electrode and a second symmetrical triangular portion extending across the drain electrode. The gate finger electrodes are coupled to the peak of the transmission lines. For example, peak 90 of the gate transmission line is connected to the gate finger 91 which gate finger 91 is disposed between the drain electrode 84 and the source electrode 94. In a similar manner, the lower peak as of the triangular drain transmission line 70 is connected directly to the drain electrode 84. Thus, as one can see, the distributed amplifier or the traveling wave amplifier depicted in FIG. 6 employs a triangular drain transmission line which is symmetrical and which basically has its lower apex or peaks connected to the drain electrodes of each of the FET transistors. In a similar manner, the gate electrode is connected to a gate transmission line which has a smaller triangle symmetrically disposed across the drain electrode and a larger triangular portion symmetrically disposed across the source electrode. The gate fingers are connected to the top piece of the gate transmission line as depicted in FIG. 6. A symmetrical distributed amplifier utilizes a plurality of cascaded stages and essentially the circuit configuration shown in FIG. 6 assumes the structure of a typical distributed amplifier. As seen, there is a drain termination 71 associated with the drain transmission line 70 and a gate termination 78 associated with the gate transmission line 75. As one can ascertain, depending on the termination, the device can be operated as a band pass amplifier if the termination is inductive or if the termination is resistive, it can be operated as a broad band amplifier. The termination impedances can be adjusted to maximize the gain bandwidth product of the amplifier. Typically, the transmission lines are microstrip lines and have relatively small line widths which, for example, can be two micrometers or less in width. The purpose of the termination impedances is to extend bandwidths so that one can avoid reflective terminations where the gate and drain terminations provide reflection and phasing to have constructive interference, while at other frequencies the reflection is minimized. The configuration depicted in FIG. 6 is a cascaded device and can be utilized for high frequency radar applications having large gain and large frequency response due to the fact that the FET devices depicted therein are Gallium Nitride devices.

Figure 7:
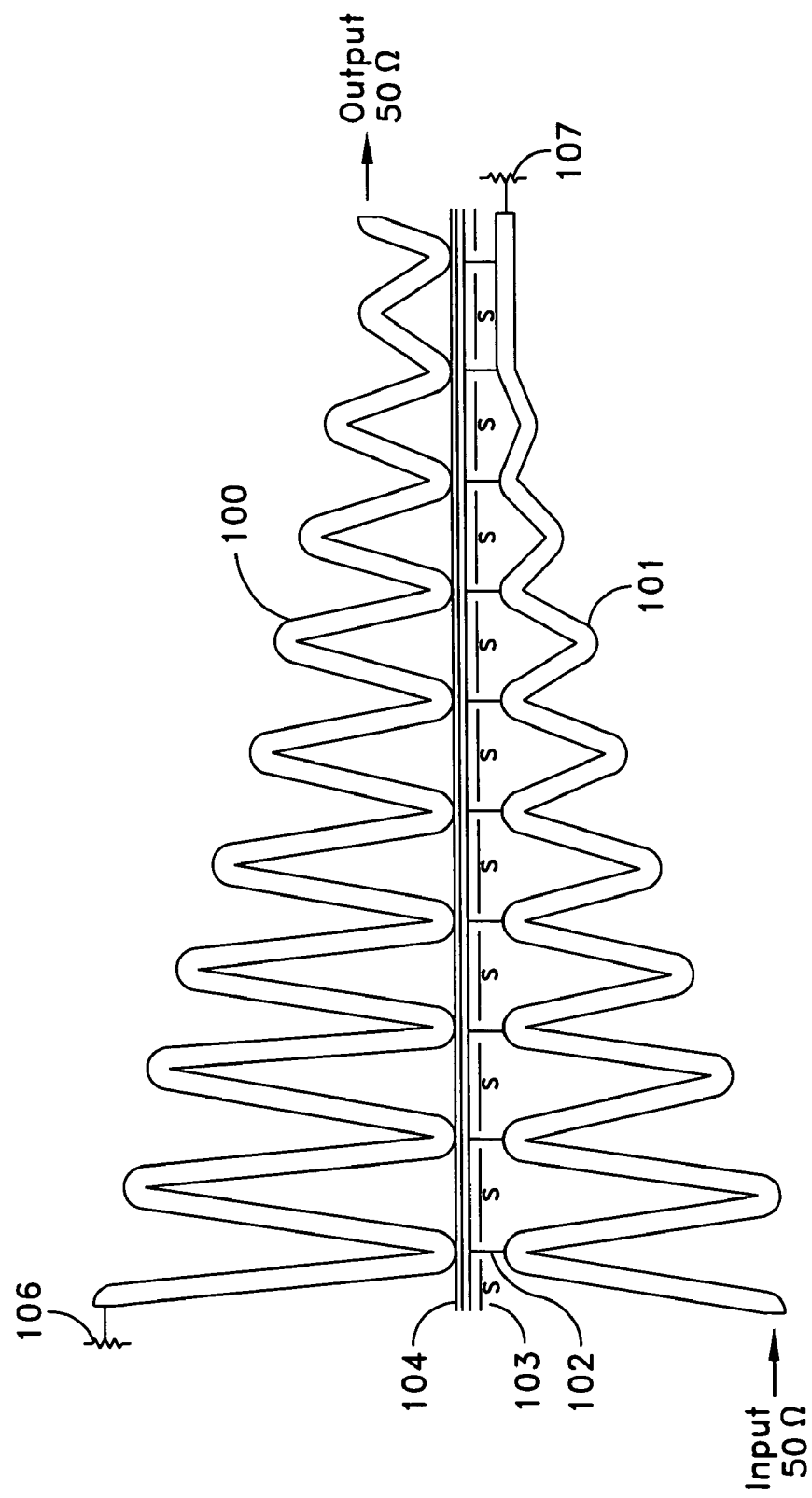
FIG. 7 depicts a distributed Gallium Nitride amplifier employing tapered drain and tapered gate transmission lines.

In FIG. 7, there is shown a cascade FET traveling wave device employing Gallium Nitride transistors. Each transistor has a source electrode 103, a drain electrode 104 and a gate electrode 102. In the configuration depicted in FIG. 7, the drain transmission line 100, as well as, the gate transmission line 101, are tapered lines. The tapered lines allow one to address the impedance level in a way that the amplitude of each signal is maintained at a constant level at each device. This occurs in spite of the fact that the power from the input line is added to the output line. In this configuration, the source electrodes may be grounded through vias or a ground plane (not shown). As one can ascertain, in the device shown in FIG. 6, the transmission lines are constant impedance lines and therefore, to obtain maximum power, such devices must be driven with the optimum voltage. In such a device, the magnitude of output signal increases as it travels down the transmission line and because of the increase in signal magnitude, there is a change in load impedance. In the circuit shown in FIG. 6, the signal on the input side is attenuated as it progresses down the drain transmission line and therefore, the Gallium Nitride transistors at the end of the amplifier are driven at a reduced level. The above-noted problems are solved by utilizing the configuration depicted in FIG. 7.

Figure 8:
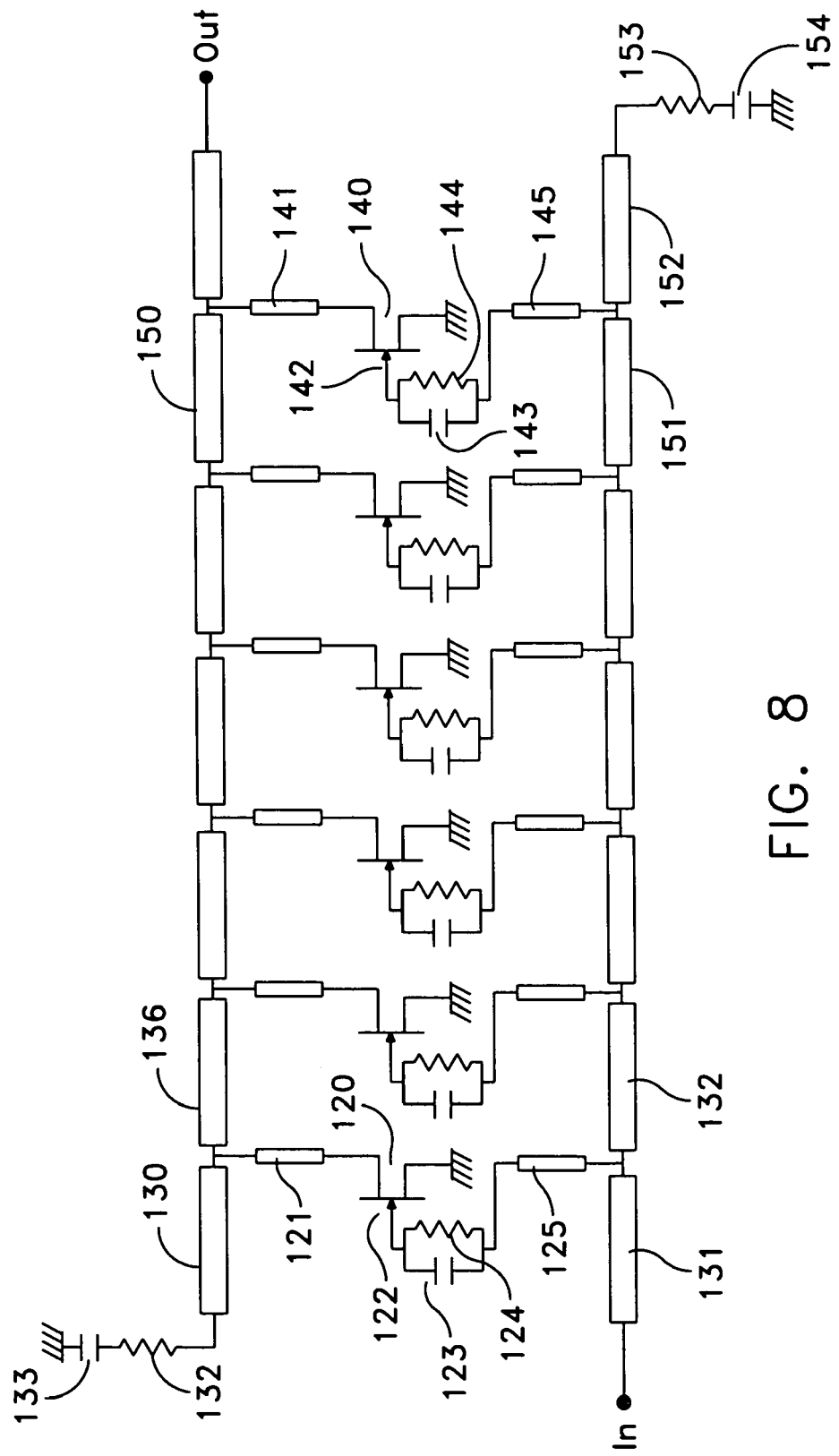
FIG. 8 depicts a circuit diagram of a distributed amplifier employing Gallium Nitride FET devices.

Referring to FIG. 8, there is shown a distributed amplifier employing six stages. Each stage includes a Gallium Nitride based FET. The Gallium Nitride FETs can be fabricated from aluminum gallium nitride which is AlGaN/GaN. Each device, as for example FET 120, has the drain electrode connected to a drain transistor 121 to a terminal of a distributed transmission line including reactive component 130 and 136. The source electrode of the FET 120 is connected to ground, while the gate electrode is connected to a parallel circuit consisting of a resistor 124 in parallel with a capacitor 123. The other junction of the capacitor 123 and resistor 124 is connected through a resistor 125 to a gate transmission line consisting of gate impedances 131 and 132. As seen, the drain transmission and the gate transmission line are basically symmetrical lines. As indicated, there is a first stage including FET 120 with a last (or output) stage which includes an identical FET 140. The FET 140, as seen, has the drain electrode connected through resistor 141 to the drain transmission line impedance 150. The gate electrode of FET 140 is also connected to a parallel circuit consisting of capacitor 143 and resistor 144 with the other terminal of the parallel circuit connected to resistor 145 to the gate transmission line including component impedances 151 and 152. The gate transmission line is terminated in a resistor 153 and capacitor 154, while the drain transmission line is terminated in resistor 132 in series with the capacitor 133. This distributed amplifier is capable of operating at high frequencies such as those employed in radar systems and has a multiplicity of stages. In the example shown above, there are at least six stages, all of which include a Gallium Nitride FET device to enable high gain with high frequency operation. As indicated above, the Gallium Nitride devices can be fabricated on diamond substrates or can be fabricated directly on silicon substrates. Various configurations as indicated above can be employed such as HEMT devices and so on.

Figure 9:
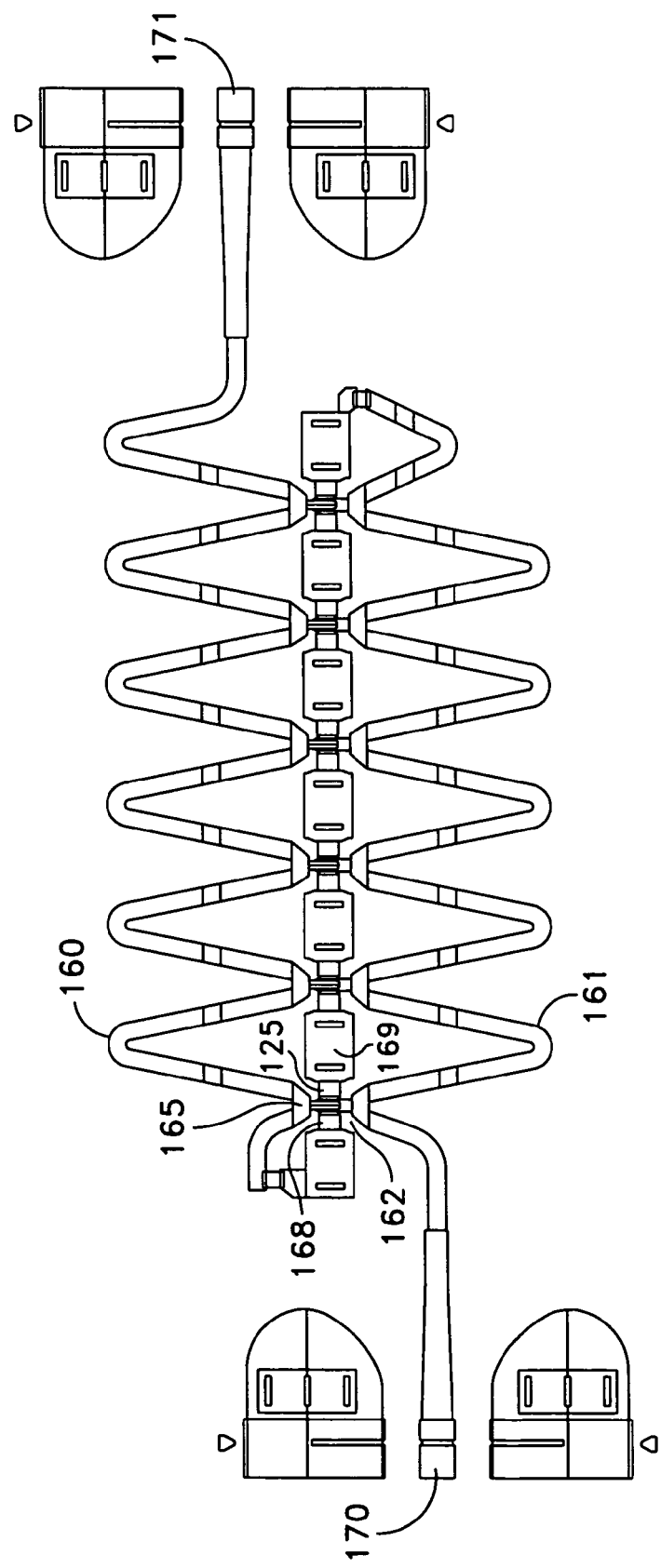
FIG. 9 depicts a coupling view of an integrated circuit configuration of a distributed amplifier employing mHEMT devices.

Referring to FIG. 9, there is shown a top view of a semiconductor structure implemented on a substrate using Gallium Nitride FETs and having a symmetrical uniform drain transmission line 160 with a uniform symmetrical distributed gate transmission line 161. As seen in FIG. 9, each FET device may be a mHEMT device with the gate electrodes of each device coupled to a symmetrically disposed distributed gate transmission line 161. The gate electrode of the first FET is connected to an apex 162 of the gate transmission line while the drain electrode of the FET is coupled to the drain transmission line 160. There is shown a resistor 165 which essentially is equivalent to resistor 121 coupling the drain in series with the transmission line 160. The gate electrode has a capacitor and resistor in parallel designated by reference numeral 168 fabricated on the integrated circuit. The source electrode 169 is coupled to ground by a resistor 125. The lines are terminated with an input terminating resistor 170 and an output terminating resistor 171. The transmission lines may be microstrip lines and, as seen, the transmission lines 160 and 161 are constant impedance lines. In this manner, an input signal is placed at terminal 170 between the terminating impedance. The terminating impedance propagates down the gate transmission line. The signal at apex 162 is coupled to the gate; whereas, the amplifier at the drain electrode produces an amplified signal. The amplified signal at the drain propagates along transmission line 160 as the propagated gate signal arrives at the gate electrode 161. Thus, as seen, there is a continuous buildup of voltage at each stage until the final output stage produces a large voltage signal at output terminal 171 which signal has a large amplitude, large voltage. The circuit shown in FIG. 9 as fabricated is extremely small and is approximately 0.8 mm by 2 mm. It is a six stage distributed amplifier which utilizes Gallium Nitride mHEMT FET devices.

Figure 10:
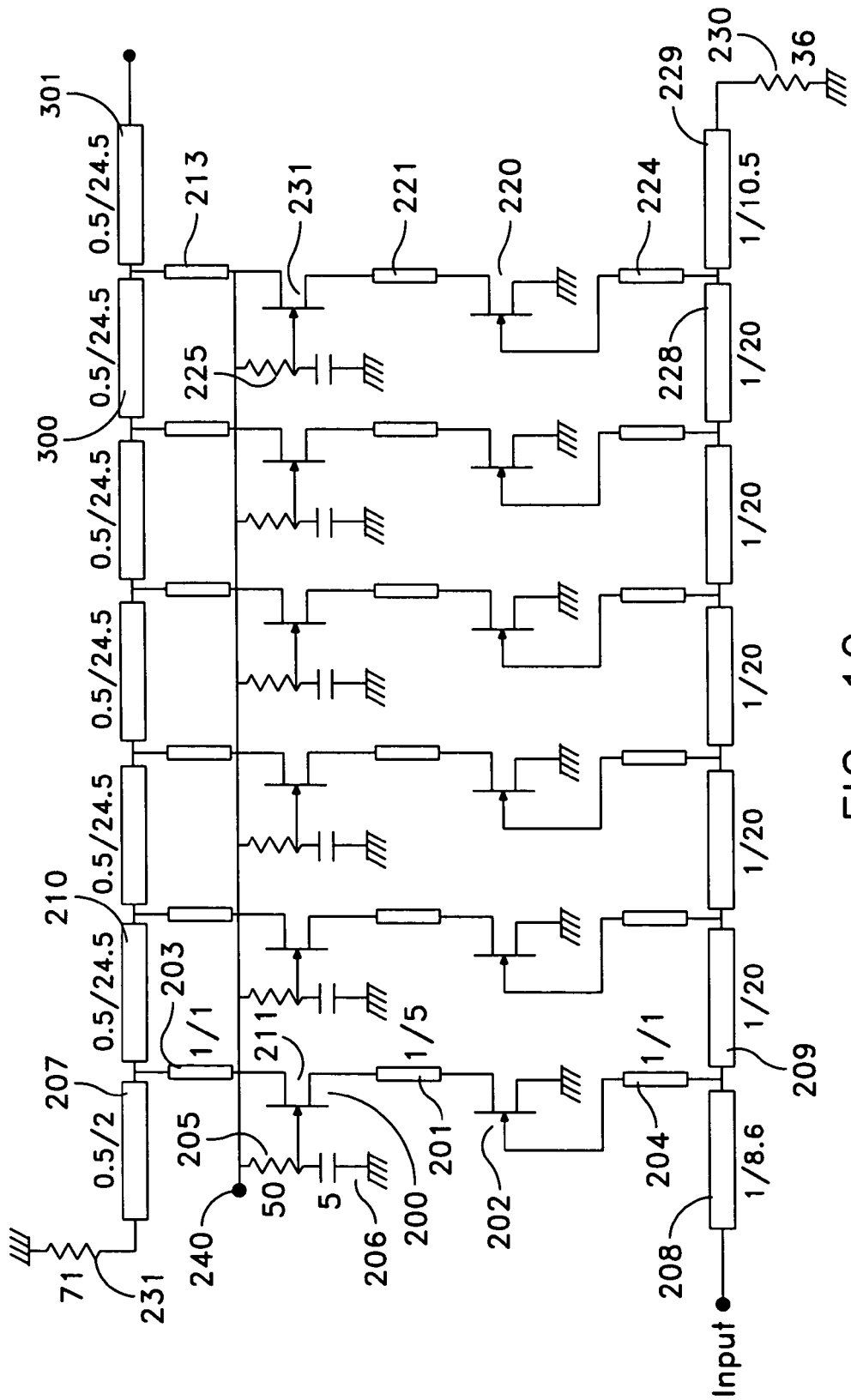
FIG. 10 is a schematic circuit diagram showing a cascode distributed amplifier employing mHEMT devices.

Referring to FIG. 10, there is shown a sixth stage cascode distributed amplifier. The cascade distributed amplifier includes a first Gallium Nitride FET 211 having its gate electrodes coupled to a point of reference potential via resistor 205. One terminal resistor 205 is coupled to a capacitor 206 which has the other terminal coupled to ground. In series with the source electrodes is a resistor 201. Resistor 201 couples the source electrode of FET 211 to the drain electrode of FET 202. FET 202 is also a Gallium Nitride device. FET 202 has its source electrode coupled to a point of reference potential with its gate electrode coupled to a resistor 204 to a gate transmission line including impedances 208 and 209. In a similar manner, the drain electrode of FET 211 is coupled by a resistor 203 to a drain transmission line including impedances 207 and 210. The drain transmission line is terminated in a resistor 231 which couples the transmission line to ground.

As indicated, the amplifier depicted in FIG. 10, is a cascode amplifier having six stages with the last stage also including a Gallium Nitride FET 220 having its gate electrode coupled to the gate transmission line via resistor 224. The gate transmission line includes impedances 228 and 229. The drain electrode of FET 220 is coupled by a resistor 221 to the source electrode of FET 231. The FET 231 has its drain electrode coupled to the drain transmission line components 300 and 301 by resistor 213. The gate electrode of resistor 231 is also coupled to a point of operating potential via resistor 225 whose other terminal is coupled to one terminal capacitor 226. The junction between resistor 225 and capacitor 226 is coupled to the gate electrode of FET 231 while one terminal to the capacitor is grounded. As one can see, the configuration for the cascode distributed amplifier includes six identical stages (for example stages one and six) described in conjunction with FET devices 202 and 220. The cascode amplifier stage of each device basically assures that the FET 211 has its gate electrodes grounded to all signal frequencies. Thus, the stage 211 operates as a common gate circuit. The gate electrode of FET 202 operates the input via resistor 204 as being coupled to the gate transmission line. This provides a high input impedance to the circuit besides increasing the gain due to operation of FET 202. In order to achieve even higher gain, the resistor 203 may be increased in value to further increase the gain providing also a wide bandwidth and excellent linearity. Thus, each stage operating cascode allows the circuit to have a high input impedance while the grounded gate amplifier means that there is no feedback from gate source and there is little or no feedback in the circuit. The capacitance between the drain and gate electrode of the FET is isolated with the signal being coupled to the source electrode due to operation of the FET 202. Such a circuit has a better linearity and a much higher frequency response. As seen in the figure, the comparative values of the various impedance elements are shown by the numerals placed above the same. For example, impedance 208 is designated as 1/8.6 while impedance 207 is designated as 0.5/2. These are the relative values of the impedances with respect to one another. As seen, at termination, resistor 231 has a relative impedance value of 71 while the termination resistor 234 for the drain transmission line has a value of 36. There is approximately 2/1 difference in value. The other values are shown based on the numbers indicated above each.

Figure 11:
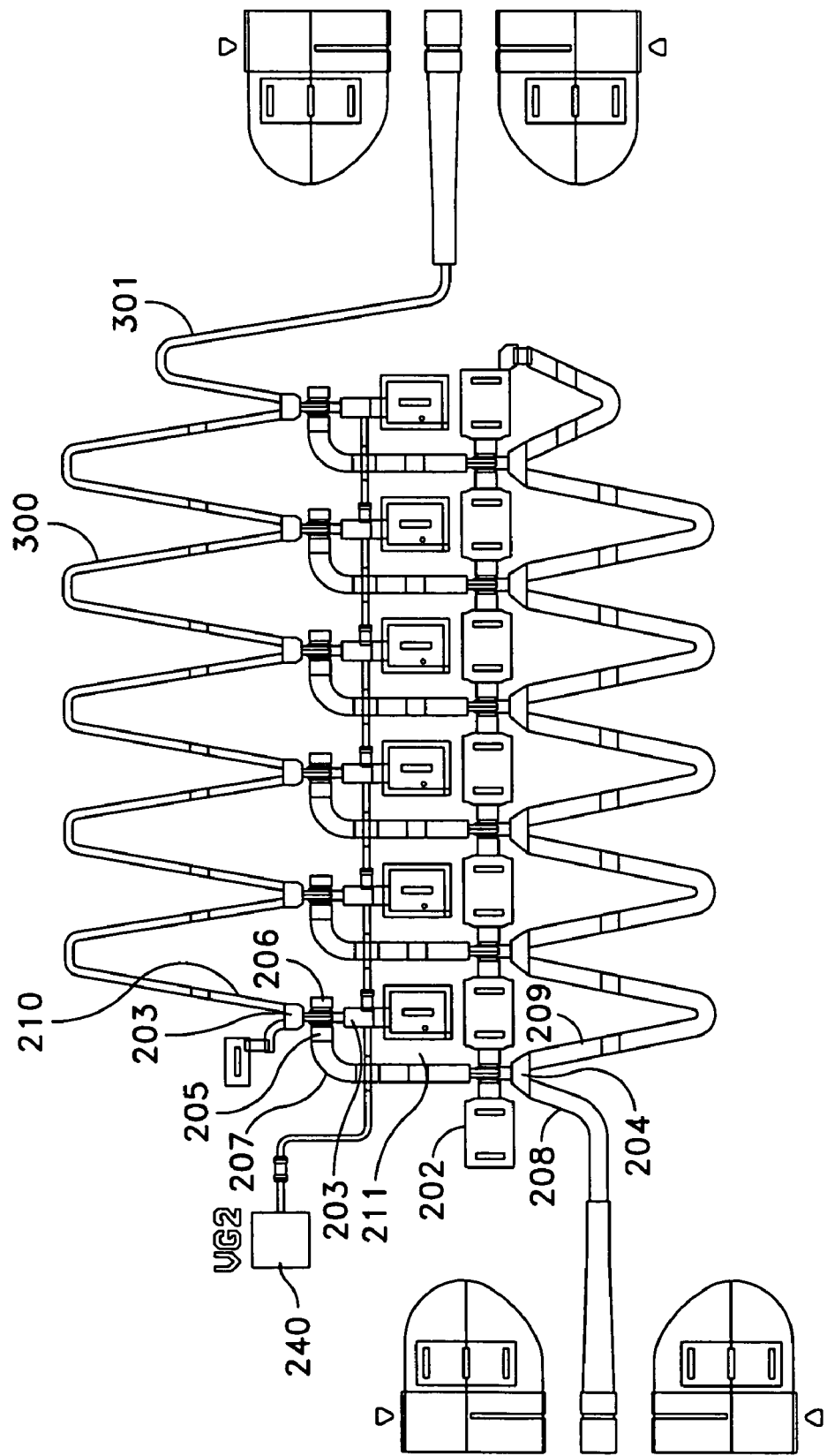
FIG. 11 depicts the integrated circuit replication of the device shown in FIG. 10 fabricated as an integrated circuit.

Referring to FIG. 11, there is shown the actual semiconductor or integrated circuit implementation of the circuit shown in FIG. 10. In FIG. 11, the same component values are employed to depict similar parts. There is shown the FET 211 which has its gate electrode coupled to the common terminal between resistor 205 and 206. Resistor 205 is directed to a point of operating potential capacitor 206 served to bypass the gate electrode of FET 211 from all AC signals. The FET 202 is shown having its drain electrode coupled through resistor 201 to the source electrode of FET 211. Both FET 202 and FET 211 are Gallium Nitride devices. As shown in FIG. 11, this is a circuit application of other devices including the fabrication of the drain and gate transmission lines which is shown in FIG. 10 in general with impedance configurations. The voltage applied to the gate electrode from terminal 240 in FIG. 10 is also shown in FIG. 11, referenced by the same terminal number. In essence, the FET 211 operates as a common gate circuit as the gate electrode of transistors 205 and 231 are both grounded for AC signals via capacitors 206 and 226. Other circuits exhibit extremely high gain and high frequency as compared to a single stage Gallium Nitride FET device used in a distributed amplifier as, for example, shown in FIG. 8 and FIG. 6.

Figure 12:
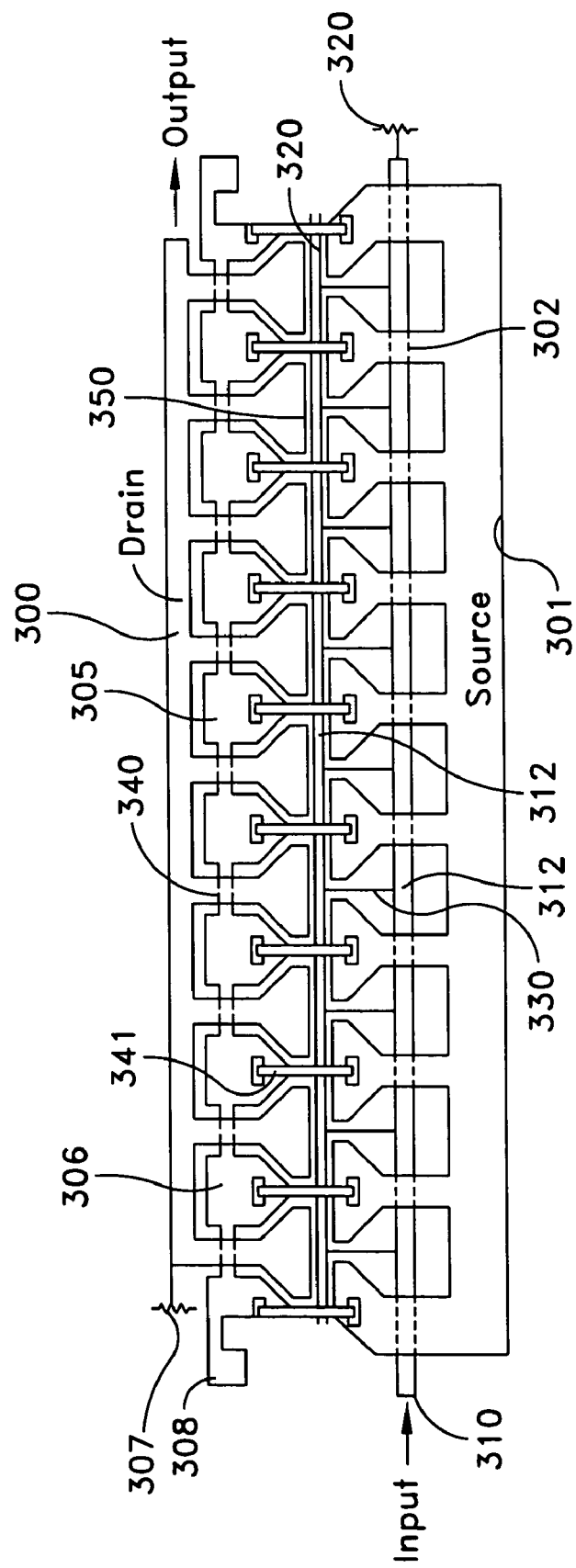
FIG. 12 is an integrated circuit top plan view of a dual gate traveling wave transistor employed as a traveling wave amplifier.

Referring to FIG. 12, there is shown a integrated circuit configuration depicting a dual gate traveling wave transistor amplifier employing Gallium Nitride devices. A source electrode 301 represents a common source of a dual gate traveling wave amplifier. The gate electrode 312 is associated with a gate finger 330. The gate finger 330 extends from the gate electrode and interfaces with a gate transmission line 312. The gate transmission line has air bridges 302 thereon and has a terminating impedance 320. The input to the distributed amplifier is at input terminal 310 which is the input to the gate transmission line. The drain electrode of device 300 is coupled to a drain transmission line 350. The drain transmission line also includes air bridges 340. The second gate has terminating capacitors 305 and 306 distributed there throughout. Essentially the second gate electrode has a resistor and a capacitor coupled to the same to thereby again bypass signals based on a second gate electrode and thereby have increased amplification for the device operating similar to a cascode amplifier. The terminating capacitor for the second gates are coupled via arms 341 to the source electrodes 301. The dual gate configuration as shown in FIG. 12 enables the construction of a variable gain amplifier. In this manner, the biasing on the second gate electrode can be varied to thereby vary the gain of the FET associated with the dual gate. Dual gate FETs are conventionally available; however, it is not known to utilize a dual gate FET in a distributed amplifier employing Gallium Nitride devices. The above described improved distributed amplification traveling wave devices operate with wide bandwidth utilizing Gallium Nitride semiconductors. Such semiconductors can be fabricated on diamond coated silicon carbide substrates in very high power density. The higher operating voltage of Gallium Nitride-based semiconductors allows higher powered, higher impedance than with any other technology. The combination allows improved thermal performance, increased bandwidth efficiency, operating frequency and higher power levels than that of conventional approaches. This is particularly suitable for operation with phased radar and EW arrays as well as jammer and decoy systems. Thus, by using the high breakdown voltage and high frequency capabilities of Gallium Nitride FETs, one can obtain extremely broadband (multi-octive) power amplification extending into W-band frequencies. One can therefore obtain high frequency, high power operation with a increased number of cascaded stages over prior art techniques thereby allowing much higher frequencies and superior operation in regard to conventional devices.

There has been shown an improved traveling wave device constructed from Gallium Nitride FET devices. The use of Gallium Nitride provides unmatched termination impedances for traveling wave devices, results in cost reduction in smaller size and therefore one can provide lighter weight transmit/receive modules for more compact radar systems. There is an increased performance improvement in regard to operating frequency bandwidth, efficiency and power increase. The low capacitance between gate and source electrode and high power density of the Gallium Nitride transistors allows finer distribution of power by distributing the capacitance in smaller sections. This enables the distributed amplifier architecture to operate with a larger number of sections before the point of limited gain bandwidth is reached. A larger number of sections allows wider bandwidth than existing state-of-the-art amplifiers. The higher operating voltage of Gallium Nitride based semiconductors allows high power at higher impedance. This is very beneficial to the distributed architecture where the power combining is serial in nature, with the last device seeing more power contribution than the preceding devices. The combination of the traveling wave device with Gallium Nitride FETs, allows increased bandwidth, increased efficiency, increased operating frequencies and power levels over conventional approaches. All these characteristics enhance the performance of phased-array radar systems and other systems requiring high frequency, high power operation. The above-noted devices have many applications in regard to missile seeker technology, Ka and W-band radar systems, and also benefits the lower frequency applications. These devices can be efficient dual-L and X-band radar transmit devices. Commercial applications may include collision and avoidance radar systems for use in automobiles and for other purposes as well. Greater than decade band performance (2-24 GHz) can be attained at high power levels for wideband jammers and decoys. This frequency range is also suitable for improved low noise amplifiers that may be used in EW systems.

It should be apparent to those skilled in the art that there are many modifications that can be employed. While the foregoing invention has been described with reference to the above described embodiment, various modifications and changes can be made without departing from the spirit of the invention. Accordingly, all such modifications and changes are considered to be within the scope of the invention.

What is claimed is:

1. A traveling wave device comprising at least one active Gallium Nitride (GaN) FET device having a plurality of gate feeding fingers connecting a gate electrode to an input gate transmission line, and having a drain electrode connected to an output drain transmission line, with the source electrode connected to a point of reference potential
wherein said GaN FET is a dual gate FET, wherein a gate has a plurality of gate fingers, wherein gate fingers of said gate are conversed to a gate transmission line, and with said other gate adapted to be coupled to a source of potential for varying the gain of said FET according to the magnitude of said potential source.

2. The traveling wave device according to claim 1, wherein said at least one active GaN FET device is a High Electron Mobility Transistor (HEMT).

3. The traveling wave device according to claim 1, wherein said at least one active GaN FET is fabricated on a top surface of a silicon carbide (SiC) substrate.

4. The traveling wave device according to claim 1, wherein said input gate transmission line has a first termination impedance for providing reflection at a first frequency.

5. The traveling wave device according to claim 4, wherein said output drain transmission line has a second termination impedance for providing reflection at said first frequency.

6. The traveling wave device according to claim 1, wherein said drain and gate transmission lines are microstrip lines.

7. The traveling wave device according to claim 3, further including a ground plane formed on said bottom surface of said SiC substrate.

8. The traveling wave device according to claim 7, further including a via formed in said substrate to contact said source electrode of said FET to therefore connect said source electrode to reference potential.

9. The traveling wave device according to claim 1, wherein said GaN device is formed on a silicon substrate.

10. The traveling wave device according to claim 4, wherein said first frequency is greater than 50 GHz.

11. The traveling wave device according to claim 1, wherein said input gate transmission line is a tapered transmission line having a taper from a large valve at an input end to another valve at an output end.

12. The traveling wave device according to claim 1, wherein said output drain transmission line is a tapered transmission line having a taper from a large valve at an input end to a small valve at an output end.

13. The traveling wave device according to claim 1, wherein said drain electrode is conversed to said drain transmission line via a resistive impedance.

14. The traveling wave device according to claim 1, wherein said source electrode is connected to a point of reference potential via a resistive impedance.

15. The traveling wave device according to claim 1, wherein each gate electrode is coupled to said input gate transmission line via a frequency responsive circuit.

16. The traveling wave device according to claim 15, wherein said circuit is a capacitor in parallel with a resistor one terminal of said circuit connected to said gate electrode said other terminal connected to said gate transmission line.

17. A traveling wave device comprising at least one active Gallium Nitride (GaN) FET device having a plurality of gate feeding fingers connecting a gate electrode to an input gate transmission line, and having a drain electrode connected to an output drain transmission line, with the source electrode connected to a point of reference potential,
wherein said GaN FET is a epitaxial device fabricated on a diamond coated silicon carbide substrate.

18. A traveling wave device comprising a plurality of Gallium Nitride (GaN) amplifier circuits arranged in cascode from a first circuit to a last circuit, each circuit being a cascode amplifier having a first GaN FET in series with a second GaN FET with the source electrode of said first FET connected to a point of reference potential, a gate transmission line, having a semiconductor for corresponding tracks, with the gate of said first FET connected to an associated terminal of said gate transmission line, with the drain of said first FET connected to the source of said second FET,
a drain transmission line having input terminals for connection levels with the drain of said second FET connected to an associated input terminal of said drain transmission line with the gate electrode of said second FET directed to a point of reference potential through a frequency relative network operative to bypass all signal frequencies to said point of reference potential to cover said second FET to operate said common gate circuit with each circuit cascaded by the respective connection of said circuits to said gate and drain transmission lines.

19. The traveling wave device according to claim 18 wherein each FET is a GaN mHEMT.

* * * * *